(12) United States Patent
Mordkovich

(10) Patent No.: US 7,348,854 B1
(45) Date of Patent: Mar. 25, 2008

(54) AUTOMATIC BIASING AND PROTECTION CIRCUIT FOR FIELD EFFECT TRANSISTOR (FET) DEVICES

(75) Inventor: Mikhail Mordkovich, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 85 days.

(21) Appl. No.: 11/413,810

(22) Filed: Apr. 28, 2006

(51) Int. Cl.
*H02H 7/20* (2006.01)

(52) U.S. Cl. .................. 330/298; 330/285; 330/85
(58) Field of Classification Search ........... 370/298, 370/207 P, 289, 285, 296, 85
See application file for complete search history.

(56) References Cited

U.S. PATENT DOCUMENTS

| | | | |
|---|---|---|---|
| 3,509,460 A * | 4/1970 | Mizrahi | 324/111 |
| 4,459,553 A * | 7/1984 | Diller | 330/85 |
| 7,113,043 B1 * | 9/2006 | Jin et al. | 330/279 |

* cited by examiner

*Primary Examiner*—Henry Choe
(74) *Attorney, Agent, or Firm*—Siegmar Silber

(57) ABSTRACT

A transistor biasing circuit is shown that utilizes a negative feedback loop control circuit to set the gate bias voltage in the output transistors of a power amplifier. This control circuit has a current sensor in series with the drain of the transistor, the current sensor output in turn feeding a dc signal into a dc amplifier, and the output of the dc amplifier driving a gate bias integrator which forms a dc control loop for maintaining the bias point. The output transistor is protected from excessive temperature and/or excessive power dissipation.

35 Claims, 8 Drawing Sheets

AUTOMATIC BIASING AND PROTECTION CIRCUIT FOR FIELD EFFECT TRANSISTOR (FET) DEVICES

BACKGROUND OF THE INVENTION

1. Field of the Invention

The present invention relates to an apparatus and a method for automatically controlling the gate bias voltage for Field Effect Transistor (FET) devices, and, more particularly in FET high power amplifiers.

2. Description of the Prior Art

High power amplifier circuits often use FETs in their output and driver stages. Generally, VDMOS (vertical double-diffused MOS) FET transistors are used for frequencies up to 500 MHZ and LDMOS (laterally diffused MOS) FET transistors are used for frequencies above 500 MHZ. For the best linearity, these high power amplifiers typically operate in Class A mode. Class A amplifiers are defined as having current flowing in all of the output transistors for the entire 360 degrees of an input cycle at the full, unclipped output of the amplifier. To achieve this, the output stage is biased halfway between the cutoff value and the saturation value and the load impedance is set at a value providing the maximum undistorted output power. Thus, the output transistors require a particular positive gate bias voltage for optimal operation in the amplification mode. The gate bias voltage sets the nominal current through the channel of the transistors.

Characteristically the gate bias voltage of the transistors may vary substantially from unit to unit and from lot to lot. With the threshold gate voltage variations in the range from 1 to 7 volts, the resultant operating gate voltage is typically in the range from 3 to 9 volts. In amplifiers using a balanced circuit design with complementary output drive circuitry, there is a requirement for balancing the transistor behavior between the two branches of the balanced amplifier. This balancing is important as the third order distortion of the amplifier is minimized thereby. Normally this balancing is sufficiently satisfied when the quiescent drain current of the output transistor is equal for both branches.

Presently, the standard methods for controlling gate bias voltage include using: (1) potentiometer in a voltage divider circuit or (2) a voltage regulator with a potentiometer in a voltage divider circuit at the output of the voltage regulator or (3) a potentiometer to program the output of a variable voltage regulator. The structural disadvantages of these methods, all of which require a potentiometer, is twofold, namely, component reliability and circuit optimization. The disadvantages of component reliability is inherent by including a mechanical component—the potentiometer—in the circuit. The disadvantage of circuit optimization is that the process introduces compromise into circuit performance as the circuit is tuned for a single operating point. Further, the standard methods have the economic disadvantage of requiring labor to tune the circuit.

In the past, several methods have developed for providing matched performance in a pair of transistors for a balanced amplifier. In one method, transistors are selected at the factory for matched electrical characteristics and are packaged as a pair of matched transistors in a single package. Another approach is to fabricate matched transistors on a common substrate. These methods all carry a cost penalty for the test and select function of for the smaller batch size inherent in common substrate production. Also, the commercially available matched-characteristic transistors are limited to what is made available by the factory. Alternately, when transistors are sorted for matching characteristics by the end user, besides incurring the same labor cost penalty, there is the additional risk of purchasing unusable devices, especially of the transistors are widely divergent in electrical characteristics.

As described in the standard methods hereinabove, providing matched performance in transistors that are not inherently matched is accomplished with potentiometers to tune the gate voltages. This tuning is either directly through a voltage divider or indirectly through a variable voltage regulator. Although this allows the use of a wider range of transistors than the factory sorting methods, these methods also have the penalty of a labor cost.

One example of a FET gate voltage biasing circuit is taught by U.S. Pat. No. 6,288,613 to J. H. Bennett entitled BIAS CIRCUITS FOR DEPLETION MODE FIELD EFFECT TRANSISTORS, issued Sep. 11, 2001, which discloses a FET-based circuit that provides a controlled gate bias voltage for maintaining a set drain current in the gate-biased depletion mode FET. Additionally, this circuit maintains the selected drain current over temperature variations and again effects on the performance characteristics upon the FET. One embodiment of this circuit is also capable of providing the bias voltage for multiple FETs.

A significant drawback to the circuit taught by the '613 patent is that it requires the FETs that comprise the active elements of the circuit to all be manufactured by the same process and be integrated with one another. Such similar performance characteristics are found generally only when all of the active circuit elements formed as one integrated circuit. This patent does not teach a circuit for unmatched components and the circuit is not likely to function properly if manufactured from discrete devices.

Another example of a FET gate voltage biasing circuit is taught by U.S. Pat. No. 6,091,302 of A. Arevalo, issued Jul. 18, 2000, entitled ELECTRONIC CIRCUIT BIASING CONTROL SYSTEM which discloses a digital biasing and monitoring system for controlling the gate bias voltages of one or more FETs. This circuit monitors both drain current and ambient temperature and provides a gate bias voltage to an FET based on these monitored quantities.

The circuit taught by this patent requires considerable digital electronics to function, including a microprocessor, an A/D converter and a D/A converter. Further, Arevalo 302 is based on look-up tables programmed into the microprocessor for desired FET gate bias voltages at each increment of drain current and temperature variation.

Another FET gate voltage biasing circuit is taught by H. Sakamoto in U.S. Pat. No. 6,486,724 issued Nov. 26, 2002 and entitled FET BIAS CIRCUIT, which patent discloses a bias circuit including an operational amplifier and a reference voltage. This circuit performs closed-loop control of the FET gate voltage with the output of the operational amplifier. Further, careful choices in resistance values and temperature coefficients of the resistors in the voltage divider that comprises the reference voltage source can enable this circuit to also control the FET gate voltage versus ambient temperature changes.

One drawback to the circuit taught by the '724 patent is the use of a resistive voltage divider connected to a voltage supply rail as the reference voltage source. Here, upon a variation in the voltage supply, there is a corresponding variation in the reference voltage that is supplied to the operational amplifier. Thus, such variation results in a FET gate bias voltage shift from the desired level. Further, the closed-loop control performed by this circuit is dependent upon the voltage drop at a current limiting resistor and not from the drain-source path of the FET. This is therefore an indirect closed-loop control.

Another example of a FET gate voltage biasing circuit is taught by Poulin et al., U.S. Pat. No. 6,304,130 entitled BIAS CIRCUIT FOR DEPLETION MODE FIELD-EFFECT TRANSISTORS which discloses a bias circuit with a voltage offset circuit a transistor, a resistive path, and two power supply connections. Here, the voltage offset circuit ensure that the transistor of the bias circuit operates on a similar regime as the biased power transistor allowing both transistors to track process variations.

A significant improvement over the existing art would be a transistor biasing scheme that automatically provided a reliable and controlled gate bias voltage that remained optimized over the desired range of circuit performance and that protected the transistors from damage in cases of excessive supply voltages or excessive operating temperatures. Additionally, it would be desirable to have this transistor biasing scheme function both for pairs of matched or unmatched transistors such that the unmatched transistors performed like matched transistors over the full range of expected use conditions.

None of the above provide the automatic biasing and protection for field effect transistors utilizing the circuitry of this invention. The submission of the above discussion of documents is not intended as an admission that any such document constitutes prior art against the claims of the present application. Applicant does not waive any right to take any action that would be appropriate to antedate or otherwise remove any listed document as a competent reference against the claims of the present application.

SUMMARY

In accordance with the present invention, a transistor biasing circuit is shown that utilizes a negative feedback loop control circuit to set the gate bias voltage in the output transistors of a power amplifier. This control circuit has no elements that require tuning and no mechanically moving components. The basic operation of the biasing circuit depends on having a current sensor in series with the drain of the transistor, the current sensor output in turn feeding a dc signal into a dc amplifier, and the output of the dc amplifier driving a gate bias integrator. This group of components forms a dc control loop enabling the desired bias point to be maintained over a range of operating conditions.

Another aspect of the invention includes a means for protecting the output transistor from excessive power dissipation. When a over-voltage condition is present at the drain of the transistors, excessive power dissipation that results therefrom is capable of damaging or destroying the transistors.

Another aspect of the invention includes a means for protecting the output transistor from excessive temperature, where such excessive temperature is capable of damaging or destroying the transistors.

A further aspect of the invention includes protection for both power dissipation of the output transistor as well as excessive temperature for the output transistors.

Yet another aspect of the invention includes means for a single automatic bias control circuit to control multiple output transistors with factory-matched electrical characteristics, with this circuit optionally including means for power dissipation protection, means for excessive temperature protection for the output transistors, or both.

Yet another aspect of the invention includes means for automatic bias control circuitry to control multiple unmatched output transistors such that their performance is equivalent to that of matched devices. This matched performance bias circuit may also include means for power dissipation protection, means for excessive temperature protection for the output transistors, or both.

These various embodiments of the invention offer significant improvement to the operational durability and ruggedness of a power amplifier, and in particular to a high power RF amplifier. The general circuit operation methodologies used in the amplifier bias control and protection circuitry described hereinafter and both the DC and high frequency circuitry disclosed hereinafter are well known to those skilled in the art.

OBJECTS AND FEATURES OF THE INVENTION

It is an object of the present invention to provide, for FET transistor output stages in high power amplifiers, an automatic biasing circuit.

It is a further object of the present invention to provide protection against excessively high supply voltages as part of some embodiments of an automatic biasing circuit.

It is another object of the present invention to provide protection against excessively high operating temperatures as part of some embodiments of an automatic biasing circuit.

It is yet another object of the present invention to provide an automatic biasing circuit for producing a balanced device response in unmatched pairs of FETs in the output stages of high power amplifiers.

BRIEF DESCRIPTION OF THE DRAWINGS

A more complete understanding of the invention and its advantages will be apparent from the detailed description taken in conjunction with the accompanying drawings in which.

DESCRIPTION OF THE PREFERRED EMBODIMENT

Figure 1:
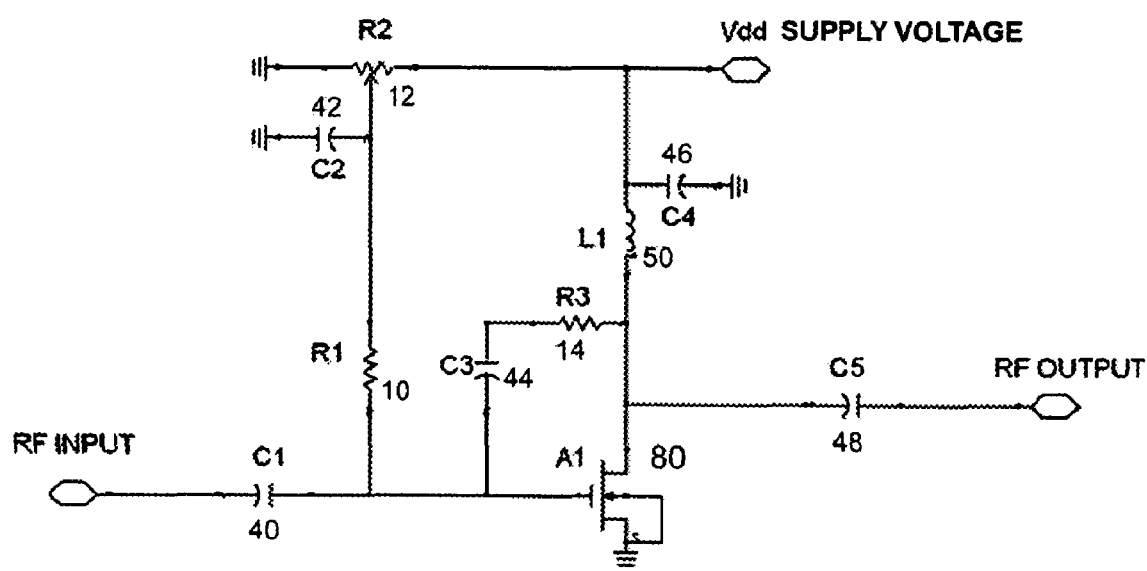
FIG. 1 is a prior art circuit showing gate bias using a potentiometer.

FIG. 1 shows a schematic of an output amplifier stage with a potentiometer-controlled gate bias circuit. The FET A1 80 requires the following components for normal operation. Capacitors C1 40 and C5 48 are DC blocking input and output capacitors. Resistor R1 10 and capacitor C2 42 are required for the application of a DC bias voltage to the gate of the transistor A1 80. Resistor R3 14 and capacitor C3 44 provide RF negative feedback. Inductor L1 50 functions as an RF choke. Capacitor C4 46 is a bypass capacitor on one end of the RF choke L1 50. Resistor R2 12 is the potentiometer that provides an adjustment for the gate voltage. The circuit of FIG. 1 has no stabilization of the gate voltage and relies completely on the voltage stability of the drain supply.

Figure 2:
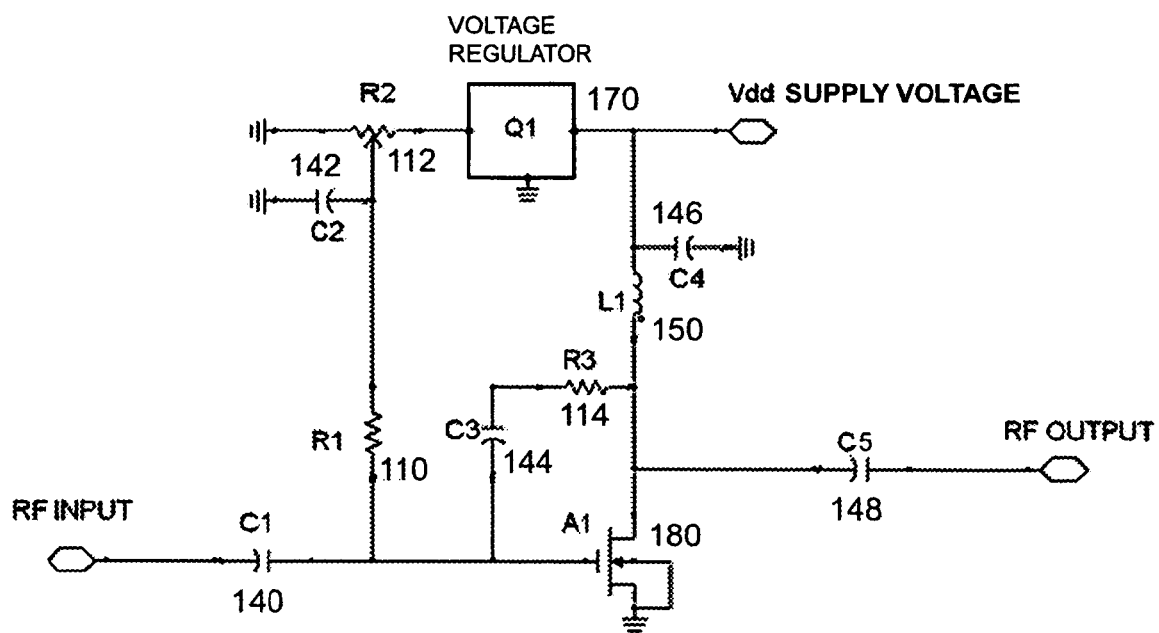
FIG. 2 is a prior art circuit showing gate bias using a fixed voltage regulator.

FIG. 2 shows a schematic of an output amplifier stage with a voltage regulator and potentiometer-controlled gate bias circuit. The voltage regulator Q1 170 supplies a fixed voltage output that is divided by potentiometer R2 112. Otherwise, the circuit of FIG. 2 is functionally identical to the circuit of FIG. 1.

Figure 3:
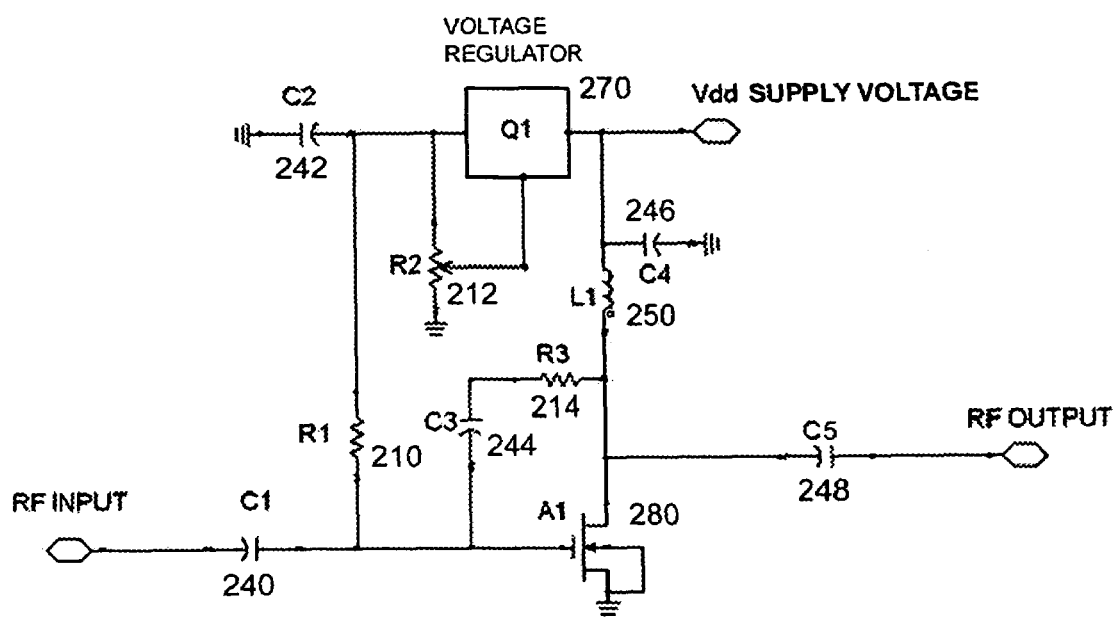
FIG. 3 is a prior art circuit showing a variable voltage regulator.

FIG. 3 shows a schematic of an output amplifier stage with a potentiometer-controlled voltage regulator driven gate bias circuit. The voltage regulator Q1 270 supplies a voltage output that is set by potentiometer R2 212. Otherwise, the circuit of FIG. 3 is functionally identical to the circuits of FIG. 1 and FIG. 2. The voltage regulators Q1 170 and 270 provide a greater degree of stability to the set gate voltage if the main supply voltage Vdd has some variation or instability.

The circuits of FIGS. 1, 2 and 3 have two major disadvantages. First, each individual transistor gate bias voltage must be manually tuned. This process starts with monitoring of the drain current, and then the potentiometer is manually adjusted in order to set the drain current to a desired value within a manufacturing limit. This is a time consuming and labor-intensive process. Second, using a mechanically tunable part such as potentiometer reduces the reliability of the amplifier. The potentiometer may lose electrical contact or experience changes in set value during the lifespan of the amplifier due to aging or mechanical stresses such as vibration or shock.

Figure 4:
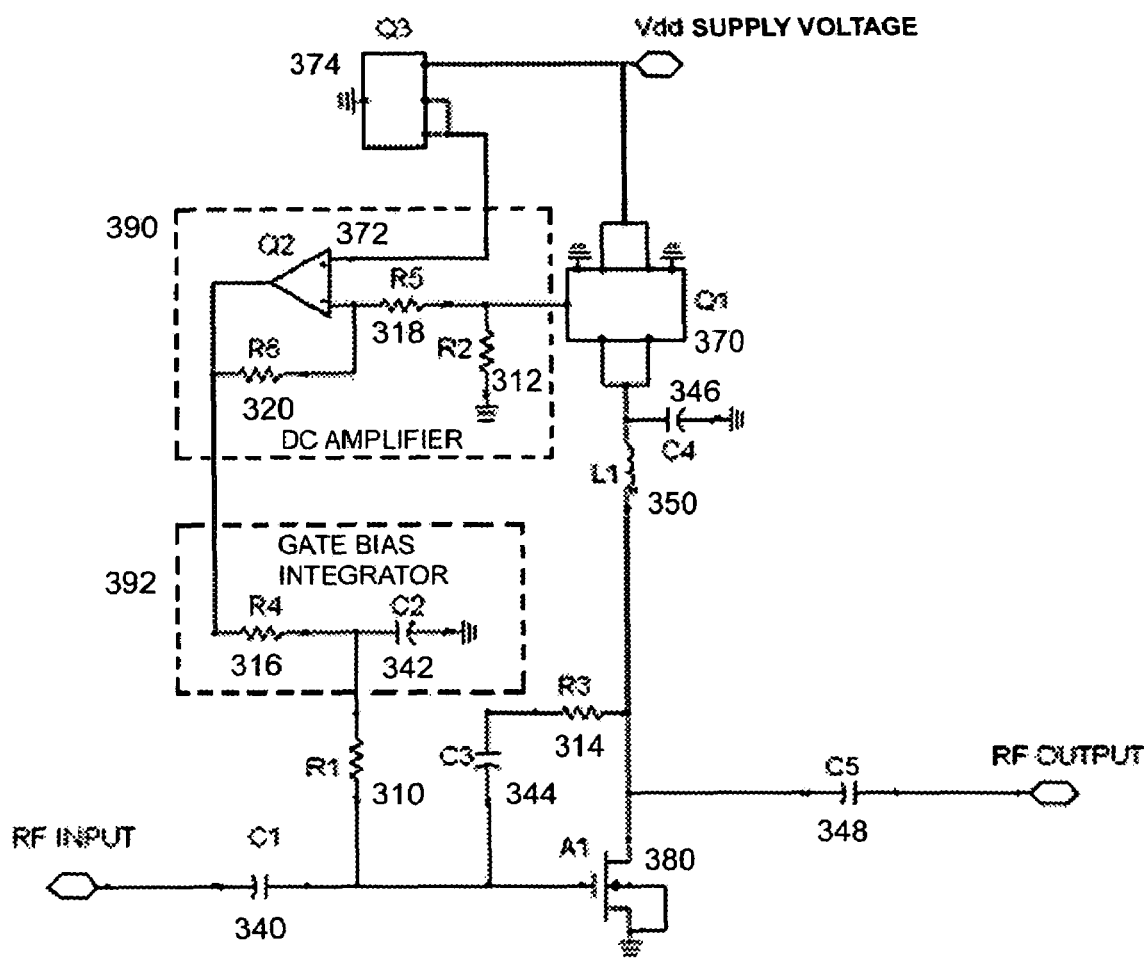
FIG. 4 is an automatic drain current stabilization circuit.

A schematic of a preferred embodiment of an output amplifier stage with an automatic drain current stabilization circuit is illustrated in FIG. 4. The output amplifier with an automatic drain current stabilization circuit utilizes a negative feedback loop control circuit to regulate the gate voltage of the output transistor A1 380. It does not have any elements that require tuning and it does not have any mechanically moving components. This stabilization circuit consists of a current sensor Q1 370 in series with the drain line of the output transistor A1 380, the DC amplifier 390 and the gate bias integrator 392 as shown in FIG. 4. Current sensor Q1 370, operational amplifier Q2 372 and transistor A1 380 form a DC control loop. Resistor R2 312 is a reference resistor for current sensor Q1 370, and this resistor value sets the drain current of the transistor A1 380. Reference voltage source Q3 374 provides the reference voltage for the operational amplifier Q2 372. Resistors R5 318 and R6 320 set the DC gain of the operational amplifier Q2 372. Resistor R4 316 and capacitor C2 342 form the voltage integrator 392. Resistor R1 310 prevents the gate of the transistor A1 380 from being RF shorted to ground by capacitor C2 342.

In further detail, the current sensor Q1 370 is typically a device such as the MAX471 from Maxim Integrated Products, Inc. or a similar integrated circuit (IC). The current sensor Q1 370 sources the sampling current proportional to the main current flowing through it to the load (drain of the FET). The sensitivity of the current sensor Q1 370 is 0.5 mA/A. Thus if the main current through the current sensor Q1 370 is 1 A, the output sampling current would be 0.5 mA. That output sampling current sinks to the ground through the resistor R2 312. The value of that resistor R2 312 and the current through it determine the resistor's voltage drop. That voltage drop is applied to the inverting input of the operational amplifier Q2 372, typically a device such as the MC34072 from On-Semiconductors or a similar operational amplifier. The non-inverting input of operational amplifier Q2 372 is connected to the precision voltage reference source IC Q3 374, typically a device such as the MAX6043BAUT50 from Maxim Integrated Products, Inc. or a similar precision reference source. The precision voltage reference source IC Q3 374 provides 5V of nominal reference voltage. If the precision requirements are not very high, a zener diode with a bias resistor could be used instead of the precision voltage reference source Q3 374.

The operational amplifier Q2 372 has a feedback resistor network comprising R5 318 and R6 320 which determine the DC gain of the operational amplifier. The DC gain of the operational amplifier Q2 372, the sensitivity of the current sensor IC Q1 370, and the forward transconductance of the FET A1 380 determine the DC loop gain of the automatic drain current stabilization circuit. The resistors R5 318 and R6 320 are preferably chosen to set the DC gain of the operational amplifier Q2 372 to 100. Alternatively, the combination of the operational amplifier Q2 372 DC gain, the sensitivity of the current sensor Q1 370 and the forward transconductance of the FET A1 380 could be used for this purpose.

The operational amplifier output signal goes through the integrator 392 formed by R4 316 and C2 342 and applied to the gate of the FET A1 380 through the resistor R1 310. Generally it is desired for the value of the resistor R4 316 to be higher than the value of the resistor R1 310. The recommended value of the resistor R4 316 is in the range of 10 k$\Omega$ to 20 k$\Omega$. Resistor R1 310 is generally in the range of 20 to 500$\Omega$. Resistors R4 316 and R1 310 have an additional important function. One of the early symptoms of FET transistor failure is high DC leakage between the gate and the source or the gate and the drain of the transistor. Thus the potentially failing transistor may have low resistance between the gate and the source or between the gate and the drain. The value of that abnormally low resistance is generally about 100 k$\Omega$ to 1000 k$\Omega$. At the same time, the RF performance of such a potentially failing transistor could be within the published specifications. Resistor R4 316 increases the source impedance of the operational amplifier Q2 372. Therefore, if the transistor has abnormally high DC leakage, the automatic gate bias circuit will not be able maintain the nominal drain current for such transistor. The resulting decrease in performance can function as an indication that FET A1 380 has a potential problem and needs replacement.

The circuit operation is as follows: When initially turned on, the gate voltage of the transistor A1 380 is approximately 0V and thus below the threshold voltage. The drain current of the transistor A1 380 is approximately 0 A. Therefore the current sensor Q1 370 output current is approximately 0 mA too. The voltage drop on the resistor R2 312 is approximately 0V and this voltage is applied to the inverting input of the operational amplifier Q2 372. The non-inverting input of the operation amplifier Q2 372 is biased by the precision voltage reference source Q3 374, which is preferably set to 5V.

Under these operating conditions the output of the operational amplifier Q2 372 goes to a high state of saturation. The output voltage of operational amplifier Q2 372 is applied to the voltage integrator 392 formed from R4 316 and C2 342. The voltage on the output of the integrator 392 rises gradually from an initial state of 0V. As soon as it rises above the threshold voltage of the transistor A1 380, the drain current starts to increase. That causes an increase of the output current of the current sensor Q1 370. The voltage drop on the resistor R2 312 goes up and that voltage is applied to the inverting input of the operational amplifier Q2 372. The output of the operational amplifier Q2 372 is still in a positive saturation state but not as deeply as during the initial conditions. When the gate voltage reaches a value corresponding to the transistor A1 380 drain current being equal to the nominal I_drain_nom current, the current sensor Q1 370 output current reaches I_sens_nom. This is defined by the equation $$I\_sens\_nom = I\_drain\_nom * k$$

Where k=0.5 mA/A for the selected IC MAX471.

The output current of the current sensor Q1 370 creates a voltage drop on the resistor R2 312 defined by the equation $$V\_inverting\_input = R2 * I\_sens\_nom$$

The value of the resistor R2 312 is chosen such that the voltage drop is equal to the voltage produced by the precision voltage source Q3 374 which is preferably 5V. When that condition is met, the operational amplifier Q2 372 comes out of a saturation state and goes into an active state. Thus any deviation in the closed regulating loop will be compensated for by the loop until the voltage difference between the inverting and non-inverting inputs of the operational amplifier Q2 372 is equal to approximately 0V. Operational amplifier Q2 372 has a small input offset voltage of around 3 mV to 5 mV. This offset voltage may be omitted or included while calculating the value of the resistor R2 312. The other source of deviation from the ideal case is sinking or sourcing current from the output of the operational amplifier Q2 372 flowing through the feedback resistors R6 320 and R5 318. That current could decrease or increase the current sourcing from the current sensor Q1 370. To minimize the effect of that deviation, the value of the feedback resistor R6 320 should be much greater than the value of resistor R2 312. In practical terms, the value of resistor RG 320 could be in the range of 200% to 1000 k$\Omega$.

In order to set a particular desired drain current, resistor R2 312 may consist of more than one component. A series/parallel combination of 2 or 3 resistors gives the flexibility to set practically any precise value of the drain current. The preferred 5V value of the precision voltage source Q3 374 is a convenient standard value, which puts both inputs of the operational amplifier Q2 372 sufficiently away from voltage rail limits. The current sensor Q1 370 has very low resistance in series with the output transistor A1 380. A typical resistance value for Q1 370 is approximately 35 m$\Omega$. The current limit for the current sensing path of the MAX471 realization of Q1 370 is approximately 3.3 A. Therefore, the series voltage drop of the current sensor Q1 370 will not exceed approximately 0.12V. In most practical cases this voltage drop is less than 0.05V. This voltage drop is negligibly low in reference to a typical drain voltage range of 24V to 28V. If the drain current requirement exceeds the current limit for a single current sensor Q1 370, two or more current sensors may be used in a parallel configuration.

Figure 5:
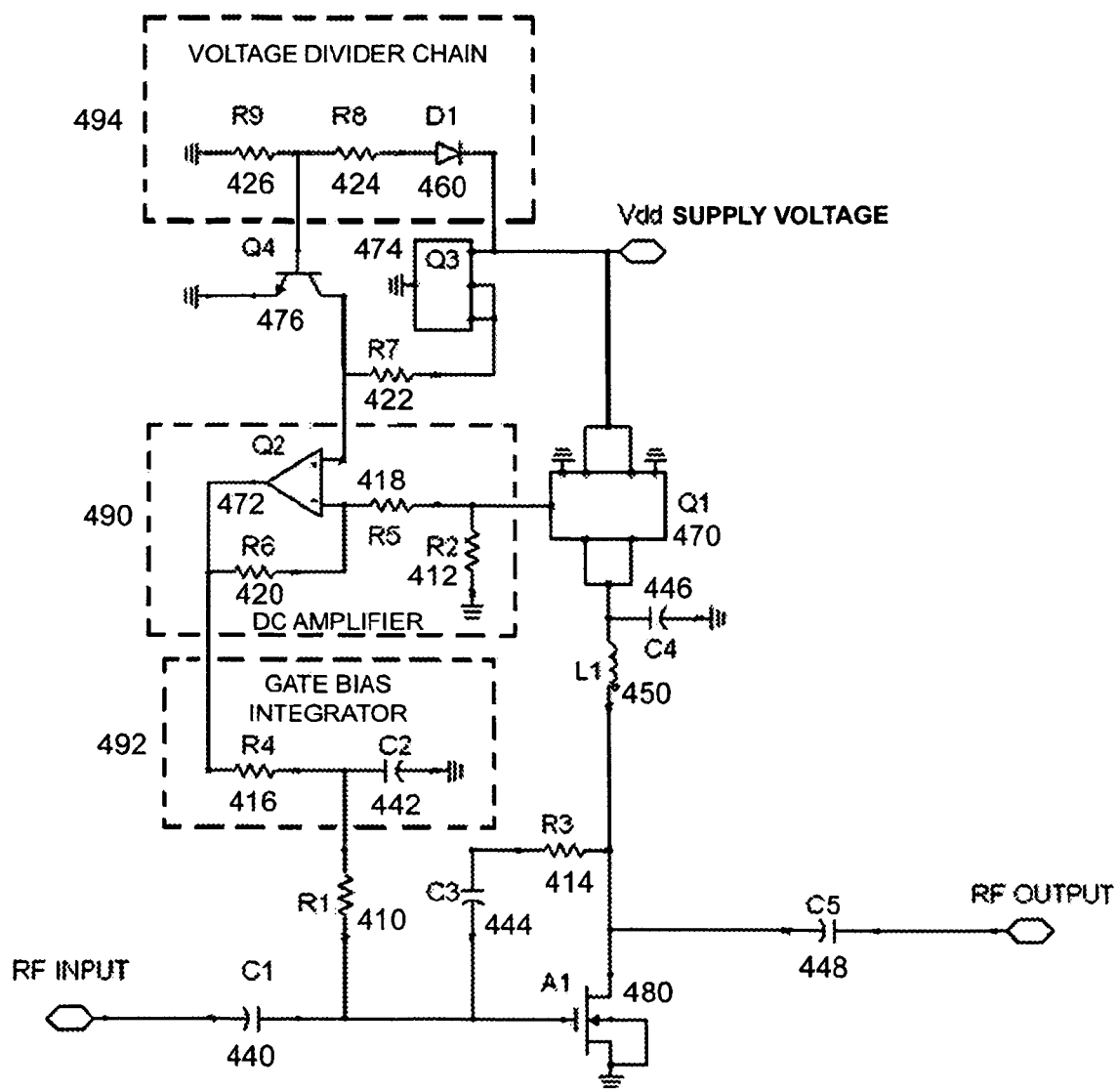
FIG. 5 is an automatic drain current stabilization circuit including an excessive supply voltage protection circuit.

FIG. 5 shows a schematic of an output amplifier stage with an automatic drain current stabilization and excessive supply voltage protection circuit. In addition to the circuitry of FIG. 4, the circuit of FIG. 5 includes a switching transistor Q4 476 with the base bias formed as a voltage divider 494. This voltage divider 494 consists of zener diode D1 460 and resistor R8 424 connected to supply voltage Vdd and the resistor R9 426 connected to the ground. Resistor R7 422 serves as a load for the switching transistor Q4 476 and for the reference voltage source Q3 474.

The embodiment of the invention illustrated in FIG. 5 uses the same basic schematic as the circuit of FIG. 4, but adds the function of protection against excessive supply voltage. This additional protection is accomplished by adding the zener diode D1 460 and a general purpose switching transistor Q4 476 in order to reduce the reference voltage applied to the non-inverting input of the operational amplifier Q2 472 down to approximately 0V. The reference voltage from the precision voltage source Q3 474 is applied to the non-inverting input of the operational amplifier Q2 472 through resistor R7 422. The value of the resistor R7 422 is not critical and may be in the range of 2 k$\Omega$ to 20 k$\Omega$. The collector of the switching transistor Q4 476 is connected to the non-inverting input of the operational amplifier Q2 472. The emitter of the switching transistor Q4 476 is connected to the ground. The base of the switching transistor Q4 476 is connected through the resistor R9 426 to ground and through the resistor R8 424 and zener diode D1 460 to the supply voltage Vdd. The zener diode D1 460 breakdown voltage is chosen using the formula $$V\_zd = V\_protection - 0.7(V).$$

In this formula V_zd is the zener diode breakdown voltage and V_protection is the desired level of supply voltage line at which the excessive supply voltage protection should be activated.

The excessive supply voltage protection circuit works as follows:

When the supply voltage Vdd is normal (below the protection level), zener diode D1 460 has a very high resistance and the potential of the base of the switching transistor Q4 476 is approximately 0V. The switching transistor Q4 476 is thus not in a conductive mode and the non-inverting input of the operational amplifier Q2 472 gets the nominal reference voltage from the precision voltage reference source Q3 474. Preferably, the input impedance of the non-inverting amplifier is quite high and is substantially higher than the value of the resistor R7 422.

Should the supply voltage Vdd rise above the protective limit, the zener diode D1 460 abruptly opens and the switching transistor Q4 476 base current abruptly increases. This causes the switching transistor Q4 476 to turn on and practically short the non-inverting input of the operational amplifier Q2 472 to ground. Thus the reference voltage on the non-inverting input of the operational amplifier Q2 472 changes from the nominal reference voltage of 5V to approximately 0V. Now resistor R7 422 serves as a load for the precision voltage source Q3 474. Following this, the stabilization circuit will automatically adjust the gate voltage of the transistor A1 480 such that the inverting voltage input is set to approximately 0V too. Thus the voltage drop on the resistor R2 412 is equal to approximately 0V, and the current through resistor R2 412 is approximately zero as well. Thus the main current flowing through the current sensor Q1 470 is approximately 0 A, and the transistor A1 480 goes to an off state.

Typically, high power RF FETs can withstand up to 65V between their drain and source when their gate voltage is approximately 0V. If the supply voltage Vdd comes back to normal (or below the protective voltage level) zener diode D1 460 shuts off, switching transistor Q4 476 shuts off too, and normal (nominal) reference voltage is restored to the non-inverting input of the operational amplifier Q2 472. That brings the amplifier circuit back to the normal operation mode.

Figure 6:
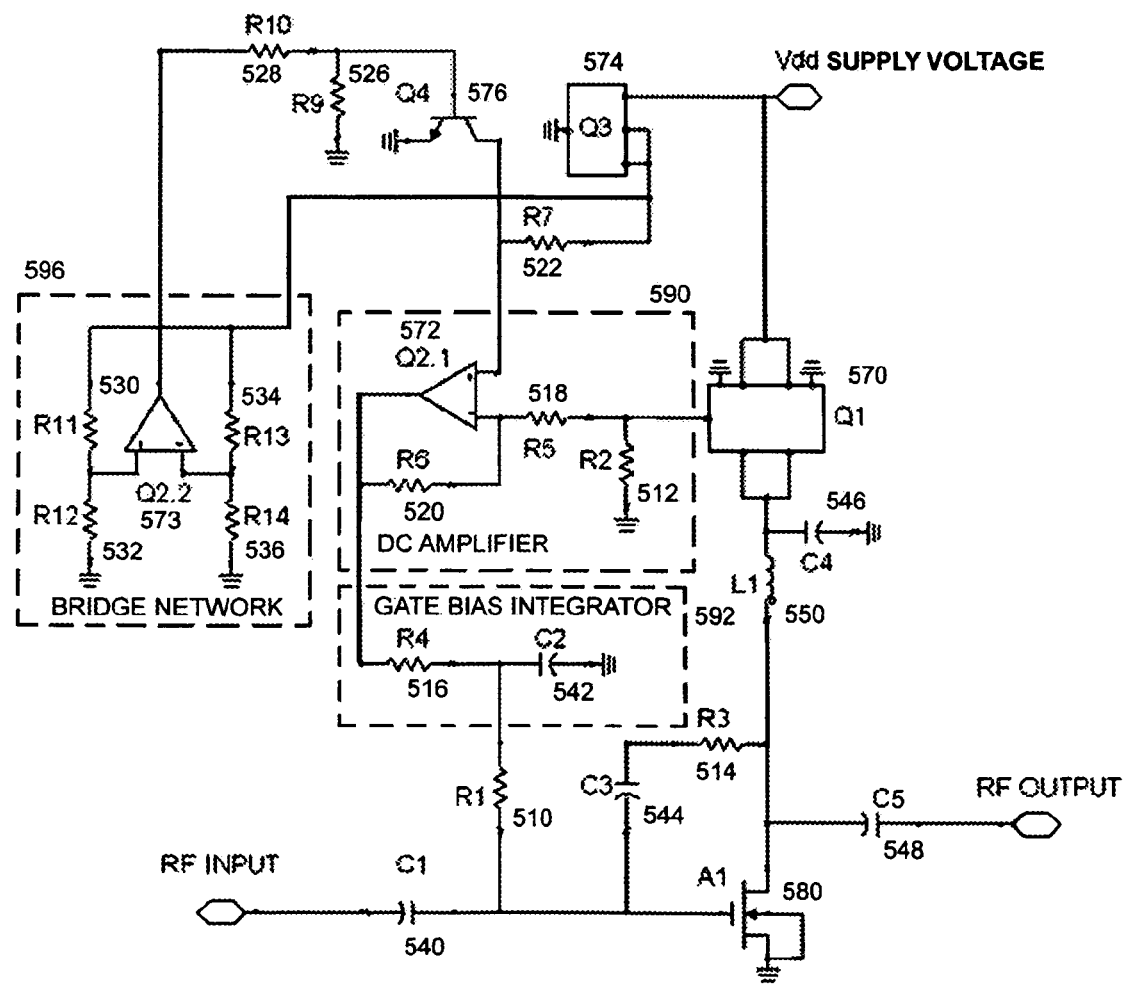
FIG. 6 is an automatic drain current stabilization circuit including an excessive temperature protection circuit.

Another preferred embodiment of the invention is illustrated in FIG. 6. This embodiment of the invention uses the same basic schematic as the circuit of FIG. 4, but adds the function of protection against excessive temperature. This additional protection is accomplished by adding an additional operational amplifier Q2.2 573 for monitoring the voltage balance in the resistive bridge 596 composed of resistors R11 530, R12 532, R13 534 and R14 536. Resistor R12 532 is a temperature sensor of the negative-temperature-coefficient (NTC) thermistor type. Resistor R10 528 limits the base current of the switching transistor Q4 576.

In further detail, the second operational amplifier Q2.2 573 is optionally of the same type as Q2.1 572, the operational amplifier controlling the bias circuit. These devices may be fabricated in a single package or may be separately packaged devices. The temperature sensing resistor network 596 is made in a well known bridge configuration. The resistors R11 530, R12 532, R13 534 and R14 536 form the bridge network 596. The precision voltage source Q3 574 is connected directly to the first diagonal of the bridge network 596, as well as to Q2.1 572 through resistor R7 522. The inputs of the second operational amplifier Q2.2 573 are connected to the other diagonal of the bridge network 596. The inverting input of the second operational amplifier Q2.2 573 is connected to the junction of resistors R11 530 and R12 532. The non-inverting input of Q2.2 573 is connected to the junction of resistors R13 534 and R14 536. Resistor R10 528 may be the same value as resistor R11 530. Resistor R14 536 should be the same value as the thermistor R12 532 at the alarm temperature point. The absolute resistance values of these resistors are not critical and may be somewhere in the range of 2 kΩ to 20 kΩ. The second operational amplifier Q2.2 573 works in an open loop mode, and thus is practically functioning as a comparator.

The output of the second operational amplifier is connected to the base of the switching transistor Q4 576 through the current limiting resistor R10 528. The value of resistor R10 528 is not critical and may be somewhere in the range of 5 kΩ to 20 kΩ.

The temperature protection circuit functions as follows: If the temperature of the thermistor R12 532 is below the upper limit of the operating temperature range, the potential at the junction of the resistors R11 530 and R12 532 is higher than the potential at the junction of the resistors R13 534 and R14 536. In that circumstance the output of the operational amplifier Q2.2 573 is in a low voltage saturation state. That low voltage is applied to the base of the switching transistor Q4 576, which is thus kept in the off state. Therefore, the voltage supplied by the precision voltage source Q3 574 is applied through the resistor R7 522 to the non-inverting input of the first operational amplifier Q2.1 572 in the main control loop.

If the temperature of the thermistor R12 532 exceeds the alarm point the potential at the junction of R11 530 and R12 532 junction drops below the potential of the junction of R13 534 and R14 536 and the output of the second operational amplifier Q2.2 573 rapidly switches to a high voltage saturation state. That high voltage is applied through the resistor R10 528 and creates a switching transistor Q4 576 base current high enough to activate the switching transistor Q4 576. The activated switching transistor Q4 576 shunts the non-inverting input of the main operational amplifier Q2.1 572. That brings the current through the main output transistor A1 580 to approximately zero. Thus, the power dissipated by the transistor A1 580 drops to zero as well. When the temperature returns back below the alarm level, the temperature protection circuit brings the main stabilization circuit back to normal operation.

Figure 7:
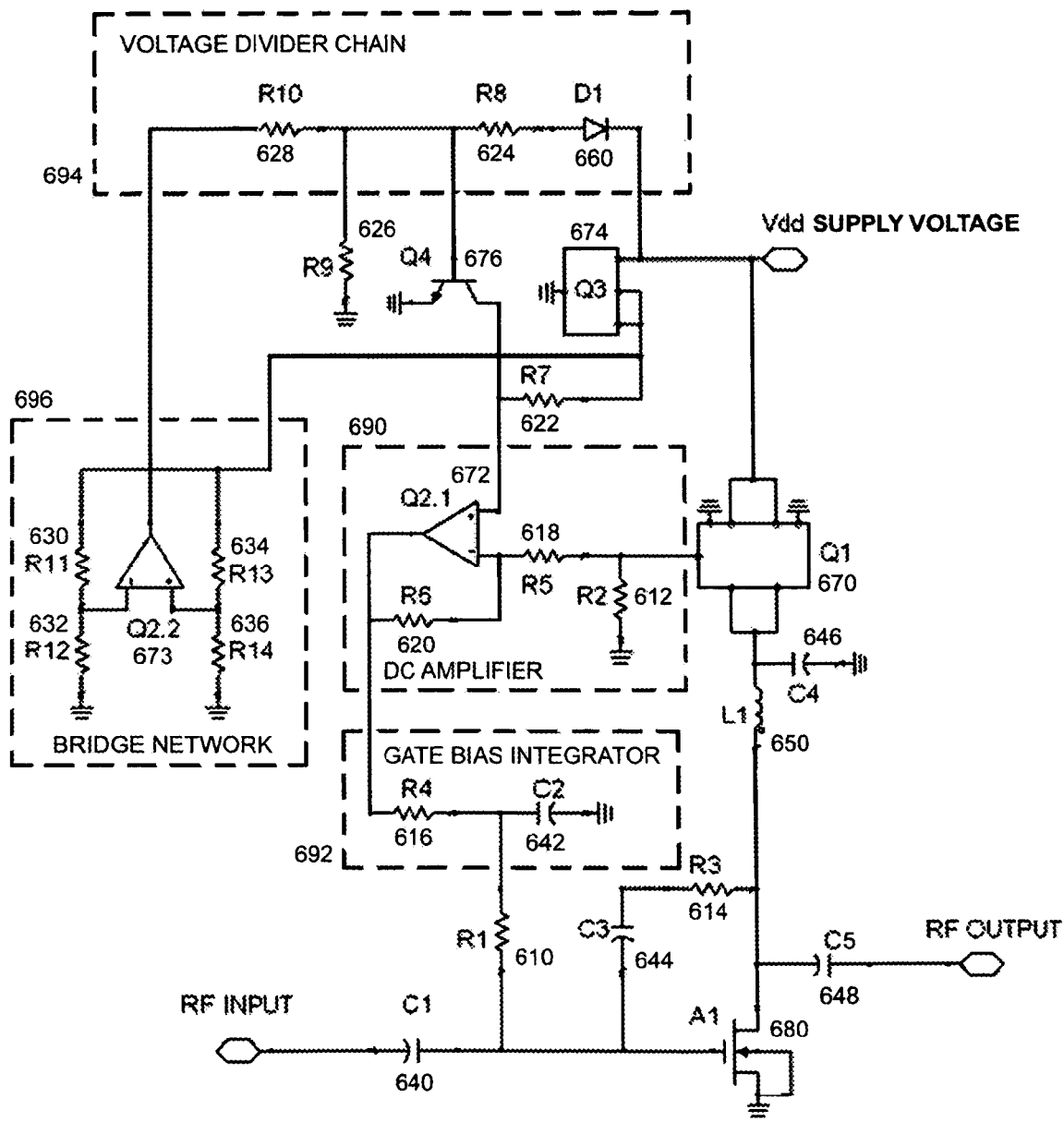
FIG. 7 is an automatic drain current stabilization circuit including both an excessive supply voltage protection circuit and an excessive temperature protection circuit.

Another preferred embodiment of the invention is illustrated in FIG. 7. This embodiment of the invention uses the same basic schematic and functional elements as the circuits of FIG. 4, FIG. 5 and FIG. 6 but adds both the functions of protection against excessive supply voltage and excessive temperature. The voltage protection and temperature protection circuits function independently and in parallel.

Figure 8:
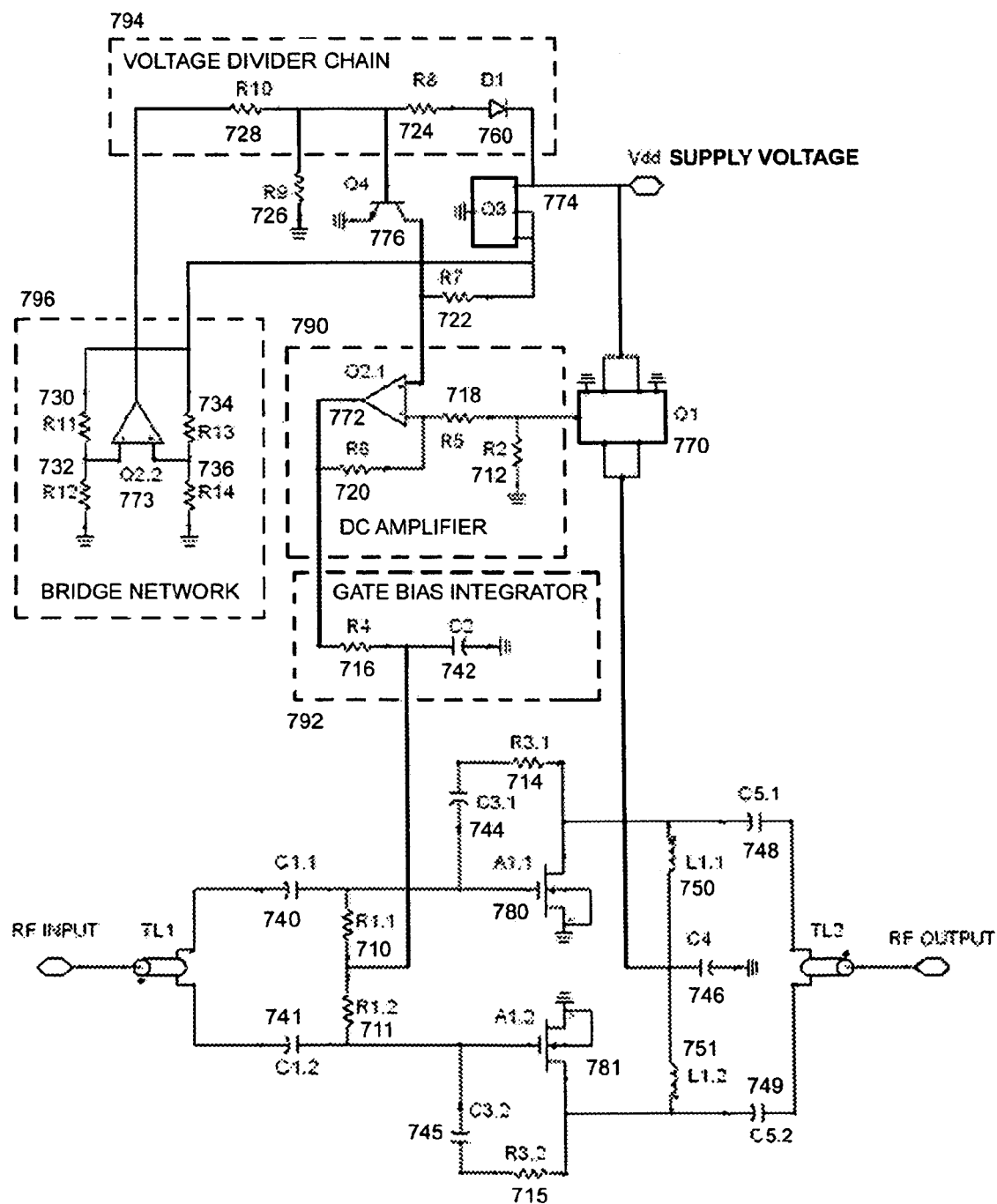
FIG. 8 is an automatic drain current stabilization circuit for a balanced amplifier, including both an excessive supply voltage protection circuit and an excessive temperature protection circuit.

Another preferred embodiment of the invention is illustrated in FIG. 8. This embodiment of the invention uses the same basic schematic and functional elements as the circuit of FIG. 7 but provides the functions of automatic drain current stabilization, an excessive supply voltage protection circuit and an excessive temperature protection circuit for a balanced amplifier circuit. The automatic drain current stabilization circuit sets approximately identical drain current in both branches of the balanced stage. If the FETs are sorted for matching electrical characteristics and mounted in a single package by a manufacturer, a common gate bias stabilization circuit may be used for both transistors in the package.

In the case of a common gate bias stabilization circuit, the current sensor Q1 770 may pass the total drain current for both transistors A1.1 780 and A1.2 781 or just the current for one of them, if the total current exceeds the current limit of a single Q1 770. In the case of the current being too high for a single Q1 770, multiple current sensors Q1 770 may be employed in parallel. The gate voltage is applied to the gates of transistors A1.1 780 and A1.2 781 through the decoupling resistors R1.1 710 and R1.2 711. The current distribution between the transistors relies on electrical characteristics matching by the manufacturer. In cases wherein the electrical characteristic matching is performed by the manufacturer, individual drain current stabilization circuits may be optionally utilized to avoid deviation from acceptable levels.

The gate bias stabilization circuit as shown in FIG. 4 through FIG. 8 is able to maintain the drain current with very small variation versus supply voltage variations, ambient temperature variations, unit-to-unit and lot-to-lot variation. The typical drain current variation is around lot or less.

In an additional embodiment, each FET in the balanced circuit as shown in FIG. 8 may have a separate drain current stabilization circuit, in which case there is no need to do any characteristics matching selection for the pairs of transistors. Even the use of transistors with similar characteristics but produced by different manufacturers will yield the same drain current value.

Other embodiments of the invention may include automatic bias control enabled power amplifier output stages operating at sub-RF frequencies, with or without excess supply voltage protection and excess temperature protection.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. An automatic gate bias control circuit for single FET device having at least a gate terminal, a source terminal, a drain terminal with a drain-source current path, and a threshold voltage required for operation thereof, said automatic gate bias control circuit comprising:

a current sensor connected in series with said drain-source current path having an output signal;

an operational amplifier having at least a pair of input nodes and an output node with one of said pair of input nodes receiving said output signal of said current sensor;

a reference voltage electrically connected to the other one of said pair of input nodes of said operational amplifier;

an operational amplifier voltage output at said output node of said operational amplifier, said operational amplifier voltage output for gate bias control;

a resistive path between said output node of said operational amplifier and said gate terminal of said FET device, said resistive path, in turn, further comprising:

a voltage integrator;

an RF-shorting preventive resistor;

said voltage integrator, upon threshold voltage of said FET device being exceeded, enabling initiation of current sensing by said current sensor and the corresponding output signal therefrom; and, said reference voltage, said current sensor and said operational amplifier forming a closed loop control for said gate bias voltage.

2. An automatic gate bias control circuit as described in claim 1 wherein said reference voltage is provided by a precision voltage reference source with a voltage output selectable between 3.0V and 21V and maintainable in the range of from −0.0% to +5% thereof.

3. An automatic gate bias control circuit as described in claim 2 wherein said reference voltage of said precision voltage reference source is 5.0V and maintained in the range of from −0.0% to +0.05% thereof.

4. An automatic gate bias control circuit as described in claim 1 further comprising:

a thermally sensitive means for driving said reference voltage at said input node of said operational amplifier to approximately ground potential.

5. An automatic gate bias control circuit as described in claim 4 wherein said thermally sensitive means is a resistive bridge including a thermistor.

6. An automatic gate bias control circuit as described in claim 5 wherein said resistive bridge is in functional cooperative relationship with said operational amplifier.

7. An automatic gate bias control circuit as described in claim 1 wherein said FET device is a high-power amplifier, said automatic gate bias control circuit further comprising:

a supply voltage electrically connected in series with said drain terminal of said FET device;

an over-voltage protection circuit, in turn, comprising:

a bipolar transistor with a base terminal, an emitter terminal, and a collector terminal; and, a voltage divider chain;

whereby, upon an over-voltage condition, said reference voltage at said input node of said operational amplifier is brought to approximately ground potential upon being conducted through said bipolar transistor.

8. An automatic gate bias control circuit as described in claim 7 wherein said voltage divider chain is a zener diode selected for conduction at a predetermined over-voltage protection level and a resistive chain functioning cooperatively therewith.

9. An automatic gate bias control circuit described in claim 8 wherein said predetermined over-voltage protection level is determined by the sum of the breakdown voltage of said zener diode and the base emitter voltage of the bipolar transistor.

10. An automatic gate bias control circuit as described in claim 9 wherein said predetermined over-voltage level is derived from the formula:

$$V_{Protection} = V_{ZD} + 0.7V$$

11. An automatic gate bias control circuit as described in claim 7 further comprising:

a thermally sensitive means for driving said reference voltage at said input node of said operational amplifier to approximately ground potential.

12. An automatic gate bias control circuit as described in claim 11 wherein said thermally sensitive means is a resistive bridge including a thermistor.

13. An automatic gate bias control circuit as described in claim 12 wherein said resistive bridge is in functional cooperative relationship with said operational amplifier.

14. An automatic biasing and over-voltage control circuit with an FET high-power amplifier having an FET therein with at least a gate terminal, a source terminal, a drain terminal, and a drain-source current path, said automatic biasing and over-voltage control circuit comprising:

a current sensor connected in series with said drain-source current path providing an output current;

a resistor conducting said output current of said current sensor, said resistor converting said output current of said current sensor to a voltage signal;

an operational amplifier having at least a pair of input nodes and an output node with one of said pair of input nodes receiving said output signal of said current sensor;

a reference voltage electrically connected to the other one of said pair of input nodes of said operational amplifier;

an operational amplifier voltage output at said output node of said operational amplifier, said operational amplifier voltage output for gate bias control;

a resistive path between said output node of said operational amplifier and said gate terminal of said FET device; and, said reference voltage, said current sensor and said operational amplifier forming a closed loop control for said gate bias voltage.

15. An automatic biasing and over-voltage control biasing and over-voltage circuit as described in claim 14 wherein said FET device has a threshold voltage required for operation thereof and wherein said resistive path between said output node of said operational amplifier and said gate terminal of said FET device further comprises a voltage integrator and an RF-shorting preventive resistor, said voltage integrator, upon threshold voltage of said FET device being exceeded, enabling initiation of current sensing by said current sensor and the corresponding voltage output therefrom.

16. An automatic biasing and over-voltage control circuit as described in claim 14 wherein said pair of input nodes of said operational amplifier is an inverting input node and a non-inverting input node and wherein said reference voltage is connected to said non-inverting input node and said voltage output of said current sensor is received by said inverting input node.

17. An automatic biasing and over-voltage control circuit as described in claim 16 wherein said reference voltage is provided by a precision voltage reference source with a voltage output selectable between 3.0V and 21V and maintainable in the range of from −0.0% to +5% thereof.

18. An automatic biasing and over-voltage control circuit as described in claim 17 wherein said reference voltage of said precision voltage reference source is 5.0V and maintained in the range of from −0.0% to +0.05% thereof.

19. An automatic biasing and over-voltage control circuit as described in claim 14 wherein said voltage divider chain is a zener diode selected for conduction at a predetermined over-voltage protection level and a resistive chain functioning cooperatively therewith.

20. An automatic biasing and over-voltage control circuit described in claim 19 wherein said predetermined over-voltage protection level is determined by the sum of the breakdown voltage of said zener diode and the base emitter voltage of the bipolar transistor.

21. An automatic biasing and over-voltage control circuit as described in claim 20 wherein said predetermined over-voltage level is derived from the formula:

$$V_{Protection} = V_{ZD} + 0.7V$$

22. An automatic gate bias control circuit for an FET amplifier having outputs from multiple FET devices with each FET device thereof having at least a gate terminal, a source terminal, and a drain terminal with a drain-source current path, said automatic gate bias control circuit comprising:
 an array of said multiple FET devices and each said drain-source current path thereof;
 a current sensor connected in series with said array, said current sensor having an output signal;
 an operational amplifier having at least a pair of input nodes and an output node with one of said pair of input nodes receiving said output signal of said current sensor;
 a reference voltage electrically connected to the other one of said pair of input nodes of said operational amplifier;
 an operational amplifier voltage output at said output node of said operational amplifier, said operational amplifier voltage output for gate bias control;
 a resistive path between said output node of said operational amplifier and a node feeding each said gate terminal of each said FET device; and,
 said reference voltage, said current sensor and said operational amplifier forming a closed loop control for said gate bias voltage.

23. An automatic gate bias control circuit as described in claim 22 wherein said FET device has a threshold voltage required for operation thereof and wherein said resistive path between said output node of said operational amplifier and said gate terminal of said FET device further comprises a voltage integrator and an RF-shorting preventive resistor, said voltage integrator, upon threshold voltage of said FET device being exceeded, enabling initiation of current sensing by said current sensor and the corresponding voltage output therefrom.

24. An automatic gate bias control circuit as described in claim 22 wherein said pair of input nodes of said operational amplifier is an inverting input node and a non-inverting input node and wherein said reference voltage is connected to said non-inverting input node and said output signal of said current sensor is received by said inverting input node.

25. An automatic gate bias control circuit as described in claim 22 wherein said reference voltage is provided by a precision voltage reference source with a voltage output selectable between 3.0V and 21.0V and maintainable in the range of from −0.0% to +5% thereof.

26. An automatic gate bias control circuit as described in claim 25 wherein said reference voltage of said precision voltage reference source is 5.0V and maintained in the range of from −0.0% to +0.05% thereof.

27. An automatic gate bias control circuit as described in claim 22 further comprising:
 a thermally sensitive means for driving said reference voltage at said input node of said operational amplifier to approximately ground potential.

28. An automatic gate bias control circuit as described in claim 27 wherein said thermally sensitive means is a resistive bridge including a thermistor.

29. An automatic gate bias control circuit as described in claim 28 wherein said resistive bridge is in functional cooperative relationship with said operational amplifier.

30. An automatic gate bias control circuit as described in claim 22 wherein said FET device is a high-power amplifier, said automatic gate bias control circuit further comprising:
 a supply voltage electrically connected in series with said drain terminal of said FET device;
 an over-voltage protection circuit, in turn comprising:
  a bipolar transistor with a base terminal, an emitter terminal, and a collector terminal; and,
  a voltage divider chain;
 whereby, upon an over-voltage condition, said reference voltage at said input node of said operational amplifier is brought to approximately ground potential upon being conducted through said bipolar transistor.

31. An automatic gate bias control circuit as described in claim 30 wherein said voltage divider chain is a zener diode selected for conduction at a predetermined over-voltage protection level and a resistive chain functioning cooperatively therewith.

32. An automatic gate bias control described in claim 31 wherein said predetermined over-voltage protection level is determined by the sum of the breakdown voltage of said zener diode and the base emitter voltage of the bipolar transistor.

33. An automatic gate bias control circuit as described in claim 32 wherein said predetermined over-voltage level is derived from the formula:

$$V_{Protection} = V_{ZD} + 0.7V$$

34. An automatic gate bias control circuit as described in claim 33 further comprising:
 a thermally sensitive means for driving said reference voltage at said input node of said operational amplifier to approximately ground potential.

35. An automatic gate bias control circuit as described in claim 34 wherein said resistive bridge is in functional cooperative relationship with said operational amplifier.

* * * * *